(12) United States Patent
Mieno

(10) Patent No.: US 8,872,243 B2
(45) Date of Patent: Oct. 28, 2014

(54) SEMICONDUCTOR DEVICE AND RELATED MANUFACTURING METHOD

(75) Inventor: Fumitake Mieno, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 110 days.

(21) Appl. No.: 13/618,004

(22) Filed: Sep. 14, 2012

(65) Prior Publication Data
US 2013/0168746 A1    Jul. 4, 2013

(30) Foreign Application Priority Data
Dec. 31, 2011   (CN) ............ 2011 1 0458242

(51) Int. Cl.
| H01L 29/76 | (2006.01) |
| H01L 27/12 | (2006.01) |
| H01L 21/84 | (2006.01) |
| H01L 21/8238 | (2006.01) |
| H01L 21/302 | (2006.01) |

(52) U.S. Cl.
USPC ........... 257/288; 257/348; 438/157; 438/212; 438/689

(58) Field of Classification Search
CPC ...... H01L 29/78; H01L 29/785; H01L 21/336
USPC .......... 257/288, 262, 330, 348, 368; 438/478, 438/589, 157, 283, 212, 689
See application file for complete search history.

(56) References Cited

U.S. PATENT DOCUMENTS

| 6,764,884 | B1* | 7/2004 | Yu et al. .................. 438/157 |
| 2004/0092067 | A1* | 5/2004 | Hanafi et al. ............. 438/212 |
| 2005/0056892 | A1* | 3/2005 | Seliskar .................... 257/348 |
| 2005/0285204 | A1* | 12/2005 | Kim et al. .................. 257/368 |
| 2006/0068591 | A1* | 3/2006 | Radosavljevic et al. .... 438/689 |
| 2011/0147840 | A1* | 6/2011 | Cea et al. .................. 257/347 |

OTHER PUBLICATIONS

J. B. Chang, et al., "Scaling of SOI FinFETs Down to Fin Width of 4 nm for the 10nm Technology Node", 2011 Symposium on VLSI Technology Digest of Technical Papers, pp. 12-13, Jun. 2011.
H. Kawasaki, et al., "Challenges and Solutions of FinFET integration in an SRAM Cell and a Logic Circuit for 22 nm node and beyond", in Tech. Dig. IEDM, pp. 289-292, Baltimore, Dec. 2009.

* cited by examiner

*Primary Examiner* — Long K Tran
*Assistant Examiner* — Dzung Tran
(74) *Attorney, Agent, or Firm* — Innovation Counsel LLP

(57) ABSTRACT

A semiconductor device manufacturing method includes providing a mask on a semiconductor member. The method further includes providing a dummy element to cover a portion of the mask that overlaps a first portion of the semiconductor member and to cover a second portion of the semiconductor member. The method further includes removing a third portion of the semiconductor member, which has not been covered by the mask or the dummy element. The method further includes providing a silicon compound that contacts the first portion of the semiconductor member. The method further includes removing the dummy element to expose and to remove the second portion of the semiconductor member. The method further includes forming a gate structure that overlaps the first portion of the semiconductor member. The first portion of the semiconductor member is used as a channel region and is supported by the silicon compound.

18 Claims, 5 Drawing Sheets

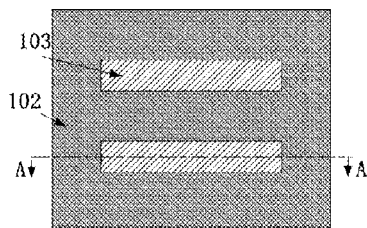 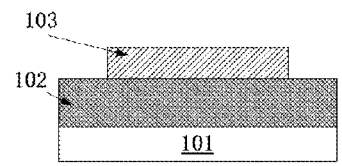
FIG. 1A  FIG. 1B
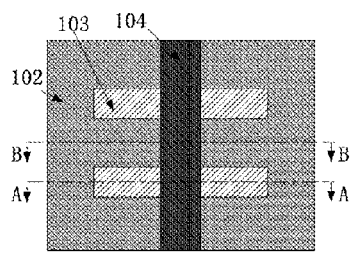 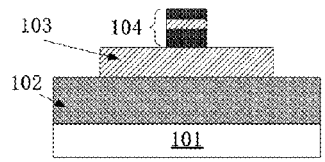 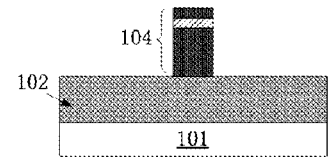
FIG. 2A  FIG. 2B  FIG. 2C
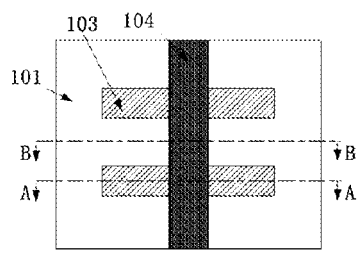 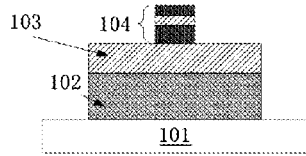 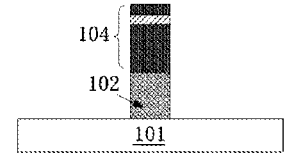
FIG. 3A  FIG. 3B  FIG. 3C

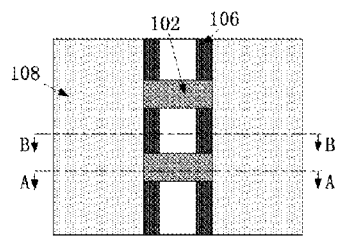
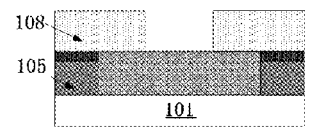
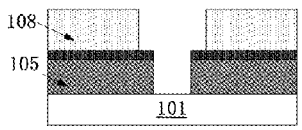
FIG. 10A    FIG. 10B    FIG. 10C
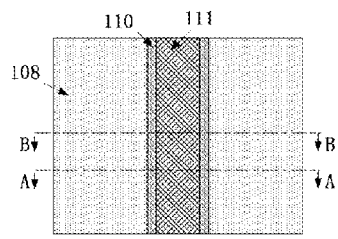
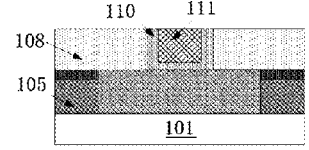
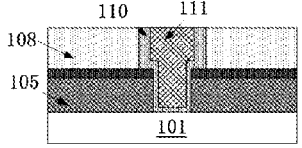
FIG. 11A    FIG. 11B    FIG. 11C

SEMICONDUCTOR DEVICE AND RELATED MANUFACTURING METHOD

CROSS-REFERENCE TO RELATED APPLICATIONS

This application claims priority to and benefit of Chinese Patent Application No. CN201110458242.1, filed on Dec. 31, 2011, which is incorporated herein by reference in its entirety.

BACKGROUND

1. Field of the Invention

The present invention relates to semiconductor devices and related manufacturing methods. For example, the present invention relates to a fin field effect transistor (FinFET) and a method for manufacturing the FinFET.

2. Description of the Related Art

For minimizing critical dimensions of semiconductor devices, various manufacturing techniques and device structures have been implemented. For example, fin structures may effectively minimize critical dimensions of semiconductor devices. Semiconductor devices having fin structures may include fin field effect transistors (FinFETs). Presently, FinFETs have been widely used in the fields of memory devices and logical devices.

In a typical FinFET, the higher the fin is, the wider the channel can be provided. On the other hand, for effectively minimizing the FinFET, it may be desirable to minimize the dimensions, particularly the thickness and/or the width, of the fin. Nevertheless, minimizing the dimensions of the fin may cause the fin to collapse and to be undesirably removed in the fabrication of the FinFET. As a result, the fabricated FinFET may not function properly.

SUMMARY OF THE INVENTION

Embodiments of the present invention may provide structural support or reinforcement for fin elements in semiconductors. Advantageously, embodiments of the present invention may at least alleviate or prevent one or more the above-described problems, and therefore may improve the yield of semiconductor device (e.g., FinFET) manufacturing.

In one or more embodiments of the present invention, a silicon compound (e.g., SiGe or SiC) may be disposed adjacent to a channel region of a semiconductor device (e.g., a FinFET) to apply stress on the channel region. Compressive stress or tensile stress in the channel region can improve the mobility of the hole or electron. Advantageously, embodiments of the present invention may substantially improve carrier mobility in semiconductor devices (e.g., FinFETs).

One or more embodiments of the present invention may be related to a method for manufacturing a semiconductor device. The method may include providing a mask on a semiconductor member. The method may further include providing a dummy element to cover a portion of the mask, the portion of the mask overlapping a first portion of the semiconductor member. The dummy element may further cover a second portion of the semiconductor member. The second portion of the semiconductor member may be adjacent to the first portion of the semiconductor member. The method may further include removing a third portion of the semiconductor member to result in a remaining semiconductor member. The third portion of the semiconductor may not have been covered by the mask or the dummy element. The remaining semiconductor member may include the first portion of the semiconductor member and the second portion of the semiconductor member. The method may further include providing a silicon compound on the remaining semiconductor member. The silicon compound may contact the first portion of the semiconductor member. The method may further include removing the dummy element to expose the portion of the mask and to expose the second portion of the semiconductor member. The method may further include removing the second portion of the semiconductor member. The method may further include forming a gate structure that overlaps the first portion of the semiconductor member. The first portion of the semiconductor member may be a fin element of the semiconductor device and may include a channel region of the semiconductor device. In the manufacturing process of the semiconductor device, the first portion of the semiconductor member may be structurally supported or reinforced by the silicon compound and may not collapse or be undesirably removed.

In one or more embodiments, the silicon compound may include at least one of SiGe and SiC.

In one or more embodiments, the silicon compound may (directly) contact two opposite surfaces of the first portion of the semiconductor member.

In one or more embodiments, the silicon compound may directly contact three sides of the first portion of the semiconductor member.

In one or more embodiments, a Ge concentration in the silicon compound may be greater than or equal to 10 mol % and may be less than or equal to 60 mol %.

In one or more embodiments, a C concentration in the silicon compound may be greater than or equal to 1 mol % and may be less than or equal to 4 mol %.

In one or more embodiments, the dummy element may include an oxide layer, a silicon nitride layer, and a silicon oxide layer, the silicon nitride layer being disposed between the oxide layer and the silicon oxide layer.

In one or more embodiments, the method may include the following steps: after the step of providing the silicon compound, depositing silicon nitride over the silicon compound; etching the mask and the silicon nitride to form spacers on two opposite sides of the dummy element; depositing a dielectric layer over the silicon compound; etching back the dielectric layer to remove the silicon oxide layer of the dummy element; depositing amorphous silicon; and performing a planarization process to expose the silicon nitride layer of the dummy element.

In one or more embodiments, the method may further include the following steps: removing the mask; removing the spacers; providing a dielectric element; providing a metal material that contacts the dielectric element and forms at least a portion of the gate structure; and performing a second planarization process after providing the metal material.

In one or more embodiments, the method may include the following step: after the step of providing the silicon compound and before the step of removing the dummy element, providing a dielectric layer that overlaps the silicon compound.

In one or more embodiments, the method according may further include the following step: etching back the dielectric layer to expose a top portion of the dummy element.

In one or more embodiments, the method may include the following steps: after the step of providing the silicon compound and before the step removing the dummy element, removing a portion of the mask that is not covered by the dummy element; providing spacers on two opposite sides of the dummy element; and providing a dielectric layer that overlaps the silicon compound, exposes a top of the dummy gate, and exposes top portions of the spacers.

In one or more embodiments, the method may further include the following steps: removing the spacers; removing a remaining portion of the mask; providing a dielectric element; providing a metal material that contacts the dielectric element and forms at least a portion of the gate structure; and performing a planarization process such that a top surface of the gate structure and a top surface of the dielectric layer are substantially flat.

In one or more embodiments, the method may include the following step: epitaxially growing the silicon compound on at least a surface of the first portion of the semiconductor member.

In one or more embodiments, the method may include the following step: oxidizing a part of silicon in the silicon compound to form silicon oxide.

In one or more embodiments, the method may further include the following steps: removing the silicon oxide; and forming silicide on a top surface of remaining silicon compound.

One or more embodiments of the invention may be related to a semiconductor device. The semiconductor device may include a semiconductor member that includes a source region, a drain region, and a channel region disposed between the source region and the drain region. The semiconductor device may further include a gate structure that overlaps the semiconductor member. The semiconductor device may further include a silicon compound element, wherein a first portion of the semiconductor member is disposed between a first portion of the silicon compound element and a second portion of the silicon compound element. For example, as can be appreciated from at least FIG. 11B and FIG. 11C, each end portion of the semiconductor member (disposed on the insulator 101) is disposed between and directly contacts two portions of the silicon compound element 105.

In one or more embodiments, the first portion of the semiconductor member may include at least one of a portion of the source region, a portion of the channel region, and a portion of the drain region.

In one or more embodiments, a first side of the first portion of the semiconductor member may directly contact the first portion of the silicon compound element, and a second side of the first portion of the semiconductor member may directly contact the second portion of the silicon compound element (as can be appreciated from at least FIG. 11B and FIG. 11C).

In one or more embodiments, a third side of the first portion of the semiconductor member may directly contact a third portion of the silicon compound element (as can be appreciated from at least FIG. 11B).

In one or more embodiments, a second portion of the semiconductor member is disposed between a first portion of the gate structure and a second portion of the gate structure. For example, as can be appreciated from at least FIG. 11B and FIG. 11C, a central portion of the semiconductor member (disposed on the insulator 101) is disposed between and directly contacts two portions of the gate structure that includes the metal element 111 and the dielectric element 110.

In one or more embodiments, the second portion of the semiconductor member may include a portion of the channel region.

One or more embodiments of the invention may be related to a method for manufacturing a FinFET. The method may include the following steps: forming a patterned hard mask on a semiconductor substrate; forming a dummy gate to cover (and/or surround) a portion of the hard mask that overlaps (and/or is right above) a first portion of the semiconductor substrate that is to be used as a channel region of the FinFET; etching the semiconductor substrate using the hard mask and the dummy gate as masks for, for example, blocking etching plasma or etching light, thereby resulting a remaining semiconductor substrate; selectively growing a silicon compound (e.g., SiGe and/or SiC) on the exposed surface of the remaining semiconductor substrate; removing the dummy gate to expose the portion of the hard mask and a portion of the semiconductor substrate that has been previously covered by the dummy gate; etching the exposed portion of the remaining semiconductor substrate using the hard mask as a mask to retain the first portion of the semiconductor substrate for forming the channel region of the FinFET; and forming a gate structure of the FinFET.

In one or more embodiments, the semiconductor substrate may be a silicon substrate and/or a silicon-on-insulator substrate.

In one or more embodiments, the step of selectively growing the SiGe or SiC may include the following step: selectively growing the SiGe, wherein the Ge concentration in the SiGe may be in the range of about 10-60 mol %. In one or more embodiments, the Ge concentration in the SiGe may be in the range of about 10-45 mol %.

In one or more embodiments, the step of selectively growing the SiGe or SiC may include the following step: selectively growing the SiC, wherein the C concentration in the SiC may be in the range of about 1-4 mol %.

In one or more embodiments, the dummy gate may include (a stack of) an oxide layer, a silicon nitride layer, and a silicon oxide layer arranged in the order from bottom to top.

In one or more embodiments, the hard mask may be formed of silicon nitride.

In one or more embodiments, the method may include the following steps after selectively growing the SiGe or SiC: depositing silicon nitride; etching the hard mask and the silicon nitride until only portions of the silicon nitride, as spacers, remain on two opposite sides of the dummy gate (which may be substantially perpendicular to a bottom surface of the semiconductor substrate); depositing an interlayer dielectric layer; etching back the interlayer dielectric layer for removing the silicon oxide layer of the dummy gate; depositing amorphous silicon; and performing a first planarization process to expose the silicon nitride layer of the dummy gate.

In one or more embodiments, the step of forming the gate structure of the FinFET may include the following steps: removing the hard mask and the spacers; depositing a high-k dielectric layer; depositing a metal gate material; and performing a second planarization process such that the top surface of the gate structure and the top surface of the interlayer dielectric layer are substantially flat.

In one or more embodiments, the method may include the following step after selectively growing the SiGe or SiC and before removing the dummy gate: forming an interlayer dielectric layer to expose a top portion (e.g., the silicon oxide layer) of the dummy gate. In one or more embodiments, the step of forming the interlayer dielectric layer may include the following step: depositing interlayer dielectric layer material; and etching back the interlayer dielectric layer material for exposing the dummy gate.

In one or more embodiments, the method may include the following steps after selectively growing the SiGe or SiC and before removing the dummy gate: removing a portion of the hard mask that is not covered by the dummy gate; forming spacers on two opposite sides of the dummy gate; and forming an interlayer dielectric layer such that a top portion of the dummy gate and top portions of the spacers are exposed.

In one or more embodiments, the step of forming the gate structure of the FinFET may include: removing the hard mask and the spacers; depositing a high-k dielectric layer; depositing a metal gate material; and performing a planarization process such that the top surface of the gate structure and the top surface of the interlayer dielectric layer are substantially flat. In one or more embodiments, the high-k dielectric layer may include hafnium oxide, and the metal gate may include (a stack of) tantalum nitride and tungsten.

In one or more embodiments, the semiconductor substrate may be etched by reactive ion etching to form the channel region.

In one or more embodiments, the SiGe or SiC may be grown through selective epitaxial growth.

In one or more embodiments, the method may include the following step: after selectively growing the SiGe, performing an oxidation process to oxidize a part of silicon in the SiGe. In one or more embodiments, the method may further include the following step: after performing the oxidation process, removing the silicon oxide on the top surface of the remaining SiGe, and forming silicide on the top surface of the remaining SiGe.

One or more embodiments of the invention may be related to a FinFET that may include the following elements: a fin extending in a length direction of a channel, the fin being formed of a semiconductor material, wherein a central portion of the fin in the channel length direction may be used as the channel region of the FinFET, and the two end portions of the fin in the channel length direction may be used as a portion of a source region and a portion of a drain region of the FinFET, respectively; a gate structure formed on (and/or directly contacting) at least two sides of the channel region; and at least one of SiGe and SiC surrounding (and/or directly contacting) (at least two sides of) each of the two end portions of the fin.

In one or more embodiments, the semiconductor material may be silicon.

In one or more embodiments, the Ge concentration in the SiGe may be in the range of about 10-60 mol %. In one or more embodiments, the Ge concentration in the SiGe may be in the range of about 10-45 mol %.

In one or more embodiments, the C concentration in the SiC may be in the range of about 1-4 mol %.

Further features of the present disclosure and advantages thereof will become apparent from the following detailed description of embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The present invention can be more clearly understood by reading the following detailed description with reference to the accompanying drawings.

FIGS. 1A-1B are a schematic top view and a schematic cross-sectional view illustrating a step of forming a patterned hard mask on a semiconductor substrate, in a method for manufacturing a FinFET according to one or more embodiments of the present invention.

FIGS. 2A-2C are a schematic top view and two schematic cross-sectional views illustrating a step of forming a dummy gate following the step of FIG. 1, in a method for manufacturing a FinFET according to one or more embodiments of the present invention.

FIGS. 3A-3C are a schematic top view and two schematic cross-sectional views illustrating a step of etching the semiconductor substrate following the step of FIG. 2, in a method for manufacturing a FinFET according to one or more embodiments of the present invention.

FIGS. 10A-10C and 11A-11C are schematic top views and schematic cross-sectional views illustrating steps of forming a gate structure following the step of FIG. 9, in a method for manufacturing a FinFET according to one or more embodiments of the present invention.

Figure 4A:
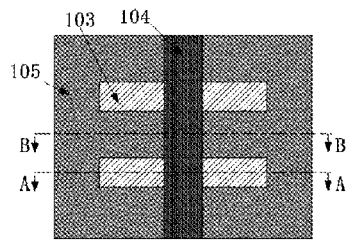
FIGS. 4A-4C are a schematic top view and two schematic cross-sectional views illustrating a step of selectively growing SiGe or SiC following the step of FIG. 3, in a method for manufacturing a FinFET according to one or more embodiments of the present invention.

It should be understood that, these drawings are provided for illustrative purposes only, and are not intended to limit the scope of the present disclosure. In the drawings, various components may not be illustrated strictly in scale or according to their actual shapes. For example, some of the components (such as layers or parts) may be enlarged relative to others so as to more clearly illustrate the principles of the present invention. Moreover, details that may obscure the gist of the present invention may not be illustrated in the drawings.

DETAILED DESCRIPTION

Various embodiments according to the present invention will be described hereinafter in detail with reference to the drawings.

It should be noted that, the relative arrangement of the components and steps, the numerical expressions, and numerical values set forth in these embodiments do not limit the scope of the present invention unless it is specifically stated otherwise. In addition, similar reference numerals and letters may refer to similar items in the following figures, and thus once an item is defined in one figure, it need not be further discussed for following figures.

The following description of embodiments is merely illustrative and is in no way intended to limit the invention, its application, or its uses. Techniques well known in the art can be applied to the parts that are not specifically illustrated or described. In all of the examples illustrated and discussed herein, any specific values should be interpreted to be illustrative only and non-limiting. Therefore, other examples or other embodiments may use different values.

Figure 12:
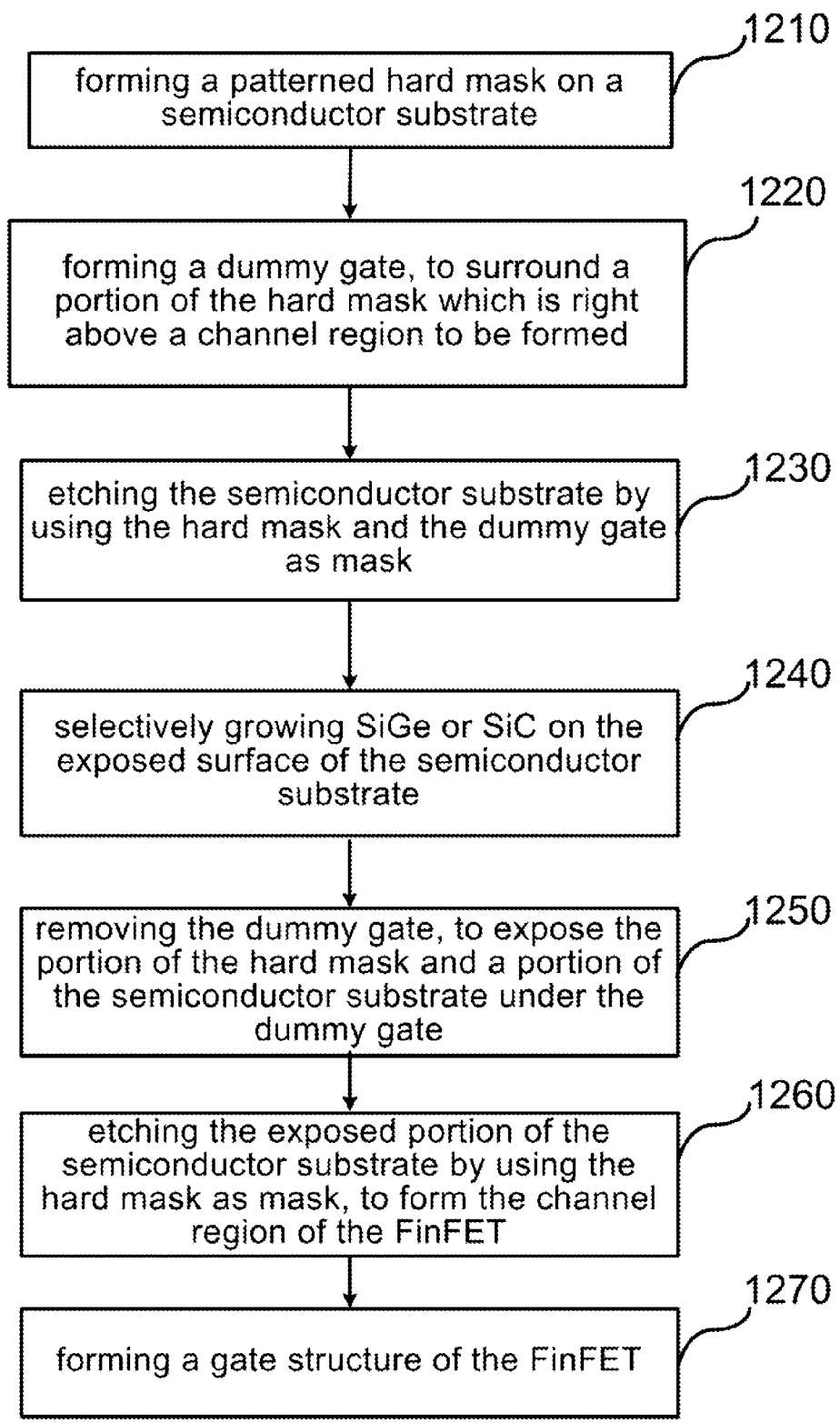
FIG. 12 is a flowchart illustrating a method for manufacturing a FinFET according to one or more embodiments of the present invention.

FIG. 12 is a flowchart illustrating a method for manufacturing a FinFET according to one or more embodiments of the present invention.

As illustrated in FIG. 12, in step 1210, a patterned hard mask is formed on a semiconductor substrate.

Subsequently, in step 1220, a dummy gate (or dummy element) is formed to surround (and/or cover) a portion of the hard mask. The portion of the hard mask substantially completely overlaps (and/or is right above) a first portion of the semiconductor substrate. The first portion of the semiconductor is to be used as a channel region of the FinFET after the FinFET has been manufactured.

Subsequently, in step 1230, the semiconductor substrate is etched using the hard mask and the dummy gate as masks for, for example, blocking an etching light or etching plasma, thereby removing a second portion of the semiconductor substrate. The second portion of the semiconductor substrate has not been covered by the hard mask and the dummy gate. A remaining semiconductor substrate is resulted.

Subsequently, in step 1240, at least one of SiGe and SiC is selectively grown on the exposed surface of the remaining semiconductor substrate.

Subsequently, in step 1250, the dummy gate is removed to expose the portion of the hard mask and a portion of the remaining semiconductor substrate, wherein the portion of the remaining semiconductor substrate is a third portion of the semiconductor substrate and has been previously disposed under (and/or overlapped by) the dummy gate.

Subsequently, in step 1260, the exposed portion of the remaining semiconductor substrate (i.e., the third portion of the semiconductor substrate) is etched using the hard mask as a mask and is removed. The remaining first portion of the semiconductor substrate may forms a channel region of the FinFET.

In step 1270, a gate structure of the FinFET is formed.

Next, a manufacturing method according to one or more embodiments of the invention will be described in detail with reference to FIGS. 1A-11C.

FIG. 1A and FIG. 1B illustrate a step of forming a patterned hard mask on a semiconductor substrate, in a method for manufacturing a FinFET according to one or more embodiments of the present invention. FIG. 1A is a top view illustrating the patterned hard mask and the semiconductor substrate, and FIG. 1B is a cross-sectional view taken along the line A-A illustrated in FIG. 1A.

In a method for manufacturing a FinFET according to one or more embodiments of the present invention, firstly, a patterned hard mask is formed on a semiconductor substrate. In the example illustrated in FIGS. 1A and 1B, the semiconductor substrate is a Silicon-On-Insulator (SOI) substrate, wherein the reference number 101 indicates an insulator layer, and the reference number 102 indicates a silicon layer. In one more embodiments, the semiconductor substrate may include one or more of other kinds of semiconductor substrates, such as a monocrystalline silicon substrate. In one or more embodiments, the semiconductor substrate may be a monocrystalline silicon substrate and may not comprise the insulator layer 101 (under the silicon layer 102).

A patterned hard mask may be formed using one or more of various methods known in the art. In one or more embodiments, the patterned hard mask 103 may be formed by depositing a hard mask layer and then etching the hard mask layer through photolithography. The hard mask 103 may be made of silicon nitride. In one or embodiments, the hard mask may be made of one or more other materials suitable for one or more particular applications.

FIG. 1A illustrates two strip-shaped hard masks 103, which correspond to two FinFETs to be formed. It should be understood that these two strip-shaped hard masks 103 are merely illustrative and that the present disclosure is not limited to this. In one or more embodiments, one or more than two strip-shaped hard masks 103 may be formed on the semiconductor substrate, and one or more than two FinFETs may be manufactured. In one or more embodiments, the pattern of the hard mask(s) may have one or more shapes and/or arrangements that may be different from the shape and arrangement illustrated in FIG. 1A, according to the design and arrangement of the FinFET(s) to be manufactured.

FIG. 2A, FIG. 2B, and FIG. 2C illustrate a step of forming a dummy gate following the step illustrated by FIG. 1A and FIG. 1B, in a method for manufacturing a FinFET according to one or more embodiments of the present invention. FIG. 2A is a top view, FIG. 2B is a cross-sectional view taken along the line A-A illustrated in FIG. 2A, and FIG. 2C is a cross-sectional view taken along the line B-B illustrated in FIG. 2A.

As illustrated in FIG. 2A, FIG. 2B, and FIG. 2C, a dummy gate 104 is formed to substantially cover a portion of a hard mask 103, wherein the portion of the hard mas 103 may be right above and/or may substantially completely overlap a portion of the semiconductor substrate where a channel region is to be formed. The dummy gate 104 may contact one or more of a first surface of the hard mask 103, a second surface of the hard mask 103, and a third surface of the hard mask 103. The first surface of the hard mask 103 may be substantially parallel to the top surface of the semiconductor substrate. Each of the second surface of the hard mask 103 and the third surface of the hard mask 103 may not be substantially parallel to the top surface of the semiconductor substrate. One or more of the second surface of the hard mask 103 and the third surface of the hard mask 103 may be substantially perpendicular to the top surface of the semiconductor substrate.

In one or more embodiments, the dummy gate 104 comprises a stack of an oxide layer, a silicon nitride layer, and a silicon oxide layer in the order from bottom to top. The oxide layer in the dummy gate 104 may be another silicon oxide layer. The oxide layer may be disposed between the semiconductor substrate and the silicon nitride layer. The silicon nitride layer may be disposed between the oxide layer and the silicon oxide layer.

In one or more embodiments, the dummy gate 104 may be made of polysilicon and/or oxide.

In one or more embodiments, the dummy gate 104 may be formed by depositing a layer of material(s) for the dummy gate and then patterning this layer. In one or more embodiments, the dummy gate 104 is patterned as a strip extending in a direction substantially perpendicular to the length direction of the hard mask 103 and covers a portion of the hard mask 103 that is right above or substantially completely overlaps a portion of the semiconductor substrate where a channel region is to be formed.

FIG. 3A, FIG. 3B, and FIG. 3C illustrate a step of etching the semiconductor substrate following the step illustrated by FIG. 2A, FIG. 2B, and FIG. 2C, in a method for manufacturing a FinFET according to one or more embodiments of the present invention. FIG. 3A is a top view, FIG. 3B is a cross-sectional view taken along the line A-A illustrated in FIG. 3A, and FIG. 3C is a cross-sectional view taken along the line B-B illustrated in FIG. 3A.

As can be appreciated from FIG. 3A, FIG. 3B, and FIG. 3C, the semiconductor substrate (primarily the silicon layer 102) is etched using the hard mask 103 and the dummy gate 104 as masks. As illustrated in FIGS. 3A-3C, after the etching, only a portion of the silicon layer 102, which is covered with the hard mask 103 and the dummy gate 104, remains. The semiconductor substrate may be etched using, for example, a reactive ion etching (RIE) technique.

Figure 4B:
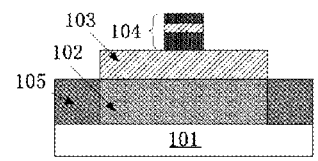
Figure 4C:
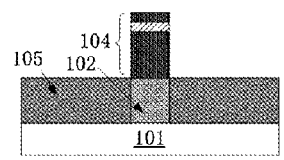

FIG. 4A, FIG. 4B, and FIG. 4C illustrates a step of selectively growing SiGe and/or SiC following the step illustrated by FIG. 3A, FIG. 3B, and FIG. 3C, in a method for manufacturing a FinFET according to one or more embodiments of the present invention. FIG. 4A is a top view, FIG. 4B is a cross-sectional view taken along the line A-A illustrated in FIG. 4A, and FIG. 4C is a cross-sectional view taken along the line B-B illustrated in FIG. 4A.

As illustrated in FIG. 4A, FIG. 4B, and FIG. 4C, after the semiconductor substrate is etched, one or more bodies 105 of SiGe and/or SiC may be selectively grown on the exposed surface of the semiconductor substrate. In one or more embodiments, the semiconductor substrate is a SOI substrate (as illustrated in FIG. 4), and SiGe and/or SiC may be selectively grown on the exposed surfaces (side surfaces in this example) of the silicon layer 102, wherein the exposed side surfaces of the silicon layer 102 may be substantially perpendicular to the top surface of the insulator layer 101. The SiGe and/or SiC may be grown by selective epitaxial growth. In one or more embodiments, only SiGe or only SiC may be selectively grown on the semiconductor substrate. In one or more embodiments, SiGe and SiC may be selectively grown at different places on the substrate according to one or more requirements. In one or more embodiments, the Ge concentration in the SiGe may be in a range of about 10-60 mol %. In one or more embodiments, the Ge concentration in the SiGe may be in a range of about 10-45 mol %. In one or more embodiments, the C concentration in the SiC may be in a range of about 1-4 mol %.

Figure 5A:
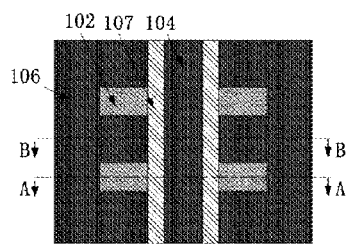
FIGS. 5A-5C are a schematic top view and two schematic cross-sectional views illustrating an optional step of performing an oxidation process and forming spacers following the step of FIG. 4, in a method for manufacturing a FinFET according to one or more embodiments of the present invention.
Figure 5B:
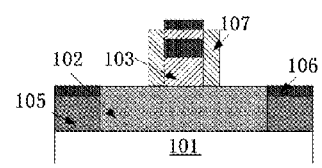
Figure 5C:
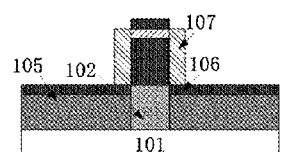

FIG. 5A, FIG. 5B, and FIG. 5C illustrate a step of performing an oxidation process and forming spacers following the step illustrated by FIG. 4A, FIG. 4B, and FIG. 4C, in a method for manufacturing a FinFET according to one or more embodiments of the present invention. FIG. 5A is a top view, FIG. 5B is a cross-sectional view taken along the line A-A illustrated in FIG. 5A, and FIG. 5C is a cross-sectional view taken along the line B-B illustrated in FIG. 5A.

As illustrated in FIG. 5A, FIG. 5B, and FIG. 5C, optionally, an oxidation process may be performed to oxidize a part of silicon in the SiGe, after selectively growing the SiGe. In one or more embodiments, a part of silicon on the exposed surface of the SiGe 105 is oxidized to form a silicon oxide 106 on the surface of the remaining SiGe 105. The oxidation process may result in tensile stress.

In one or more embodiments, the hard mask 103 is made of silicon nitride, and spacers 107 may be formed on two opposite sides of the dummy gate 104 by performing the following steps: depositing silicon nitride on at least a portion of the hard mask 103 and on at least a portion of an exposed surface of the oxide 106 (or an exposed surface of the semiconductor substrate if the oxide 106 is not formed); etching the hard mask 103 and the deposited silicon nitride, until only portions of the silicon nitride (an portions of the hard mask 103), as spacers 107, remain on the two opposite sides of the dummy gate 104.

In one or more embodiments, the portion of the hard mask 103 that is not covered by the dummy gate 104 can be first removed, and then spacers 107 may be formed on two opposite sides of the dummy gate 104.

In one or more embodiments, given that the oxidation process has been performed on the SiGe, after the spacers 107 are formed, optionally, the silicon oxide on the top of the SiGe may be removed, and then silicide (not illustrated in the drawings) may be formed on the top of the SiGe.

Figure 6A:
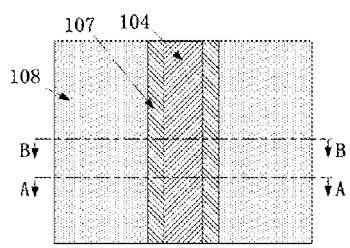
FIGS. 6A-6C, 7A-7C, and 8A-8C are schematic top views and schematic cross-sectional views illustrating steps of removing a dummy gate following the step of FIG. 5, in a method for manufacturing a FinFET according to one or more embodiments of the present invention.
Figure 6B:
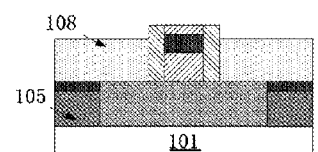
Figure 6C:
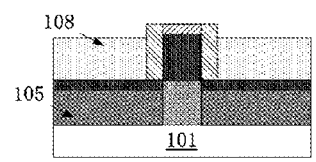
Figure 7A:
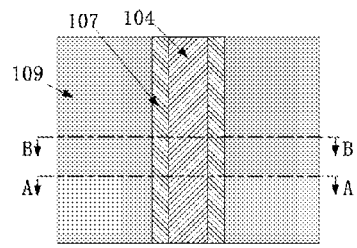
Figure 7B:
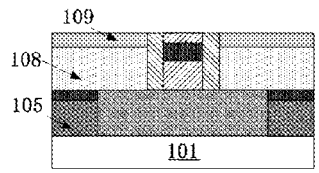
Figure 7C:
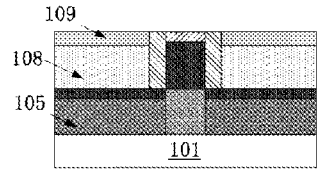
Figure 8A:
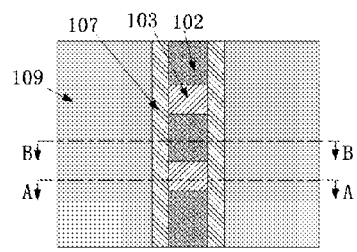
Figure 8B:
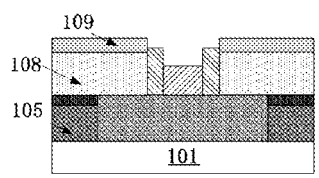
Figure 8C:
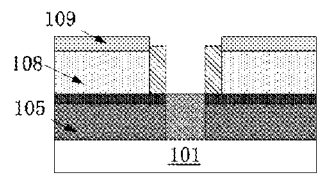

FIG. 6A, FIG. 6B, FIG. 6C, FIG. 7A, FIG. 7B, FIG. 7C, FIG. 8A, FIG. 8B, and FIG. 8C illustrate steps of removing a dummy gate (e.g., the dummy gate 104) following the step of FIG. 5A, FIG. 5B, and FIG. 5C, in a method for manufacturing a FinFET according to one or more embodiments of the present invention. FIGS. 6A, 7A, and 8A are top views; FIGS. 6B, 7B, and 8B are cross-sectional views taken along the lines A-A illustrated in FIGS. 6A, 7A, and 8A, respectively; and FIGS. 6C, 7C and 8C are cross-sectional views taken along the lines B-B illustrated in FIGS. 6A, 7A, and 8A, respectively.

After the spacers 107 have been formed, the dummy gate 104 may be removed to expose a portion of the hard mask 103 that is located right above and/or substantially completely overlaps a portion of the semiconductor substrate where a channel region is to be formed, and to exposed a portion of the semiconductor substrate that is previously disposed under the dummy gate 104.

In one or more embodiments, as illustrated in FIGS. 6A-8C, the dummy gate 104 may be removed by performing the following steps: depositing an interlayer dielectric layer 108 on the oxide 106, and etching back the interlayer dielectric layer 108 until the silicon oxide layer of the dummy gate 104 has been removed (as illustrated in FIGS. 6A-6C); depositing amorphous silicon 109 on the remaining interlayer dielectric layer 108, and performing a planarization process to expose the silicon nitride layer of the dummy gate 104 (as illustrated in FIGS. 7A-7C); and removing the silicon nitride layer and the oxide layer of the dummy gate 104 (as illustrated in FIGS. 8A-8C) In one or more embodiments, the silicon nitride layer of the dummy gate 104 may be removed using a dry etching process with end-point detection. One or more gases, such as oxygen, may be used in the dry etching process. After the removal of the silicon nitride layer of the dummy gate 104, the oxide layer (e.g., a silicon oxide layer) of the dummy gate 104 may be removed using diluted hydrogen fluoride (DHF). The planarization process may comprise a chemical mechanical polishing step or one or more equivalent steps. The depositing process may comprise a chemical vapor depositing step or one or more equivalent steps.

It should be understood that, in the manufacturing method according to the present invention, the process for removing the dummy gate is not limited to the steps illustrated in FIGS. 6A-8C. The dummy gate can be removed in one or more of various ways. In one or more embodiments, an interlayer dielectric layer may be formed on the dioxide to expose only the top of the dummy gate, and then the entire dummy gate may be removed. In one or more embodiments, an interlayer dielectric layer may be deposited, and then the interlayer dielectric layer may be etched back until exposing the dummy gate; next, the dummy gate is removed.

Figure 9A:
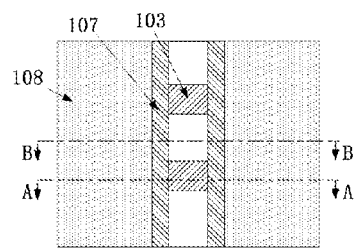
FIGS. 9A-9C are a schematic top view and two schematic cross-sectional views illustrating a step of etching a semiconductor substrate to form a channel region of the FinFET after removing a dummy gate, in the method for manufacturing a FinFET according to one or more embodiments of the present invention.
Figure 9B:
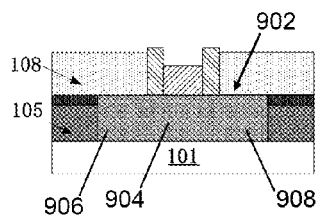
Figure 9C:
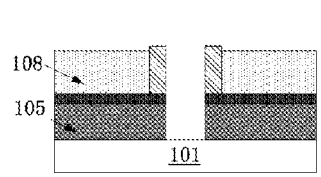

FIG. 9A, FIG. 9B, and FIG. 9C illustrate a step of etching a semiconductor substrate (e.g., the semiconductor substrate illustrated in one or more of FIGS. 1A-8C) to form a channel region of a FinFET after removing a dummy gate (e.g. the dummy gate 104), in a method for manufacturing the FinFET according to one or more embodiments of the present invention. FIG. 9A is a top view, FIG. 9B is a cross-sectional view taken along the line A-A illustrated in FIG. 9A, and FIG. 9C is a cross-sectional view taken along the line B-B illustrated in FIG. 9A.

After the dummy gate 104 has been removed, the exposed portion of the semiconductor substrate is etched using the hard mask (e.g., as a mask for blocking an etching light or etching chemical) to form a channel region of the FinFET. The semiconductor substrate may be etched using an RIE process.

In one or more embodiments, as illustrated in FIG. 9, the exposed portion of the silicon layer 102 as illustrated in FIG. 8A is etched. The remaining portion of the silicon layer 102 covered by the hard mask 103 may form a channel region 904 of the FinFET. In one or more embodiments, the amorphous silicon layer 109 also may be etched while the exposed portion of the silicon layer 102 is etched and may be removed.

As illustrated in FIG. 9B, a fin 902 made of a semiconductor (e.g., the remaining portion of the silicon layer 102) having the same pattern as the original hard mask 103 illustrate in FIG. 1A is formed. The fin extends in a length direction of a channel (i.e., the left-right direction in FIGS. 9A and 9B). A central portion of the fin in the channel length direction is used as the channel region of the FinFET, and the two end portions of the fin in the channel length direction are used as a portion of a source region 906 and a portion of a drain region 908 of the FinFET, respectively. At least one of SiGe and SiC 105 has been formed around (and enclosing) the sides of the two end portions of the fin.

FIG. 10A, FIG. 10B, FIG. 10C, FIG. 11A, FIG. 11B, and FIG. 11C illustrate steps of forming a gate structure following the step illustrated by FIG. 9A, FIG. 9B, and FIG. 9C, in a method for manufacturing a FinFET according to one or more embodiments of the present invention. FIG. 10A and FIG. 11A are top views; FIG. 10B and FIG. 11B are cross-sectional views taken along the lines A-A illustrated in FIG. 10A and FIG. 11A, respectively; and FIG. 10C and FIG. 11C are cross-sectional views taken along the lines B-B illustrated in FIG. 10A and FIG. 11A, respectively.

A gate structure of the FinFET may be formed after the channel region has been formed.

In one or more embodiments, as illustrated in FIGS. 10A-11C, the gate structure comprises a high-k dielectric layer 110 and a metal gate 111. The gate structure of the FinFET may be formed by performing the following steps: removing the hard mask 103 and the spacers 107 (as illustrated in FIGS. 10A-10C) using, for example, a hot acid such as H3PO4 (a phosphoric acid); depositing a high-k dielectric layer 110, depositing a metal gate 111, and performing a planarization process such that the top surface of the gate structure and the top surface of the interlayer dielectric layer 108 are flat (as illustrated in FIGS. 11A-11C). The planarization process may comprise a chemical mechanical polishing step. In one or more embodiments, the high-k dielectric layer 110 may comprise hafnium oxide, and the metal gate 111 may comprise a stack of tantalum nitride and tungsten. It should be understood that, the gate structure of the present disclosure is in no way limited to the above stack of a high-k dielectric layer 110 and a metal gate 111. In one or more embodiments, an appropriate gate structure may be implemented according to a particular application.

As illustrated in FIGS. 11A-11C, the formed gate structure covers (and directly contacts) three surfaces of the channel region, i.e., two side surfaces (substantially perpendicular to and/or not substantially parallel to the top surface of the FinFET) and the top surface (substantially parallel to the top surface of the FinFET). In one or more embodiments, the gate structure may be formed to directly contact only one or two of the three side surfaces of the channel region.

One or more embodiments of the invention may be related to a FinFET manufactured using one or more of the steps of the manufacturing method discussed above with reference to the examples of FIGS. 1A-11C. The FinFET may comprise one or more of the following components: a fin extending in a length direction of a channel, the fin being formed of a semiconductor, wherein a central portion of the fin in the channel length direction is used as a channel region of the FinFET, and the two end portions of the fin in the channel length direction are used as a portion of a source region and a portion of a drain region of the FinFET, respectively; a gate structure formed on and/or directly contacting at least two sides of the channel region; and at least one of SiGe and SiC surrounding and/or directly contacting the sides of the two end portions of the fin. In one or more embodiments, the semiconductor is silicon. In one or more embodiments, the gate structure comprises (a stack of) a high-k dielectric layer and a metal gate. In one or more embodiments, the Ge concentration in the SiGe is in a range of about 10-60 mol %. In one or more embodiments, the Ge concentration in the SiGe is in a range of about 10-45 mol %. In one or more embodiments, the C concentration in the SiC is in a range of about 1-4 mol %. In one or more embodiments, the high-k dielectric layer comprises hafnium oxide, and the metal gate comprises a stack of tantalum nitride and tungsten. In one or more embodiments, the gate structure also covers the top surface of the channel region. In one or more embodiments, silicon oxide exists on the surface of the SiGe due to the oxidation of a part of silicon in the SiGe. In one or more embodiments, silicide is formed on the top surface of the SiGe.

In one or more embodiments, since at least one of SiGe and SiC is formed in the source and drain regions of the FinFET, carrier mobility in the FinFET may be substantially increased. In one or more embodiments, the fin may be substantially supported by SiGe and/or SiC. As a result, the likelihood of collapse or undesirable removal of the fin may be minimized. Advantageously, the yield of the FinFET can be maximized, and the manufacturing cost of the FinFET can be minimized.

The semiconductor device and the method of manufacturing the semiconductor device according to embodiments of the invention have been described in detail. In order not to obscure the concept of the invention, some details that are well known in the art may not be described. According to the above description, those skilled in the art can thoroughly understand how to implement the technical solutions disclosed herein.

Although this disclosure have been described in detail by way of examples and/or embodiments, it should be understood by a person skilled in the art that the above examples and/or embodiments are illustrative and are not intended to limit the scope of this disclosure. It should be understood by a person skilled in the art that the above embodiments can be modified without departing from the scope and spirit of this disclosure. The scope of this disclosure is defined by the attached claims.

What is claimed is:

1. A method for manufacturing a semiconductor device, the method comprising:
    providing a mask on a semiconductor member;
    providing a dummy element to cover a portion of the mask, the portion of the mask overlapping a first portion of the semiconductor member, the dummy element further covering a second portion of the semiconductor member, the second portion of the semiconductor member being adjacent to the first portion of the semiconductor member;
    removing a third portion of the semiconductor member, the third portion of the semiconductor having not been covered by the mask or the dummy element;
    epitaxially growing a silicon compound on at least a surface of the first portion of the semiconductor member;
    removing the dummy element to expose the portion of the mask and to expose the second portion of the semiconductor member;
    removing the second portion of the semiconductor member; and forming a gate structure that overlaps the first portion of the semiconductor member.

2. The method of claim 1, wherein the silicon compound includes at least one of SiGe and SiC.

3. The method of claim 1, wherein the silicon compound contacts two opposite surfaces of the first portion of the semiconductor member.

4. The method of claim 1, wherein the silicon compound contacts three sides of the first portion of the semiconductor member.

5. The method of claim 1, wherein a Ge concentration in the silicon compound is greater than or equal to 10 mol % and is less than or equal to 60 mol %.

6. The method of claim 1, wherein a C concentration in the silicon compound is greater than or equal to 1 mol % and is less than or equal to 4 mol %.

7. The method of claim 1, wherein the dummy element includes an oxide layer, a silicon nitride layer, and a silicon oxide layer, the silicon nitride layer being disposed between the oxide layer and the silicon oxide layer.

8. The method of claim 7, further comprising:
after the step of providing the silicon compound, depositing silicon nitride over the silicon compound;
etching the mask and the silicon nitride to form spacers on two opposite sides of the dummy element;
depositing a dielectric layer over the silicon compound;
etching back the dielectric layer to remove the silicon oxide layer of the dummy element;
depositing amorphous silicon; and
performing a planarization process to expose the silicon nitride layer of the dummy element.

9. The method of claim 8, further comprising:
removing the mask;
removing the spacers;
providing a dielectric element;
providing a metal material that contacts the dielectric element and forms at least a portion of the gate structure; and
performing a second planarization process.

10. The method of claim 1, further comprising:
after the step of providing the silicon compound and before the step of removing the dummy element, providing a dielectric layer that overlaps the silicon compound.

11. The method of claim 10, further comprising:
etching back the dielectric layer to expose a top portion of the dummy element.

12. The method of claim 1, further comprising:
after the step of providing the silicon compound and before the step removing the dummy element, removing a portion of the mask that is not covered by the dummy element;
providing spacers on two opposite sides of the dummy element; and
providing a dielectric layer that overlaps the silicon compound, exposes a top of the dummy gate, and exposes top portions of the spacers.

13. The method of claim 12, further comprising:
removing the spacers;
removing a remaining portion of the mask;
providing a dielectric element;
providing a metal material that contacts the dielectric element and forms at least a portion of the gate structure; and performing a planarization process such that a top surface of the gate structure and a top surface of the dielectric layer are substantially flat.

14. The method of claim 1,
wherein the silicon compound contacts the first portion of the semiconductor member.

15. The method of claim 1, further comprising:
oxidizing a part of silicon in the silicon compound to form silicon oxide.

16. The method of claim 15, further comprising:
removing the silicon oxide; and
forming silicide on a top surface of remaining silicon compound.

17. A method for manufacturing a semiconductor device, the method comprising:
providing a mask on a semiconductor member;
providing a dummy element to cover a portion of the mask, the portion of the mask overlapping a first portion of the semiconductor member, the dummy element further covering a second portion of the semiconductor member, the second portion of the semiconductor member being adjacent to the first portion of the semiconductor member;
removing a third portion of the semiconductor member, the third portion of the semiconductor having not been covered by the mask or the dummy element;
providing a silicon compound that contacts the first portion of the semiconductor member;
after the step of providing the silicon compound, providing a dielectric layer that overlaps the silicon compound;
after the step of providing the dielectric layer, removing the dummy element to expose the portion of the mask and to expose the second portion of the semiconductor member;
removing the second portion of the semiconductor member; and
forming a gate structure that overlaps the first portion of the semiconductor member.

18. A method for manufacturing a semiconductor device, the method comprising:
providing a mask on a semiconductor member;
providing a dummy element to cover a portion of the mask, the portion of the mask overlapping a first portion of the semiconductor member, the dummy element further covering a second portion of the semiconductor member, the second portion of the semiconductor member being adjacent to the first portion of the semiconductor member;
removing a third portion of the semiconductor member, the third portion of the semiconductor having not been covered by the mask or the dummy element;
providing a silicon compound that contacts the first portion of the semiconductor member;
oxidizing a part of silicon in the silicon compound to form silicon oxide;
removing the dummy element to expose the portion of the mask and to expose the second portion of the semiconductor member;
removing the second portion of the semiconductor member; and
forming a gate structure that overlaps the first portion of the semiconductor member.

* * * * *